(12) United States Patent
Megrant

(10) Patent No.: US 11,545,608 B2
(45) Date of Patent: Jan. 3, 2023

(54) REDUCING DISSIPATION AND FREQUENCY NOISE IN QUANTUM DEVICES USING A LOCAL VACUUM CAVITY

(71) Applicant: Google LLC, Mountain View, CA (US)

(72) Inventor: Anthony Edward Megrant, Mountain View, CA (US)

(73) Assignee: Google LLC, Mountain View, CA (US)

( * ) Notice: Subject to any disclaimer, the term of this patent is extended or adjusted under 35 U.S.C. 154(b) by 548 days.

(21) Appl. No.: 16/333,058

(22) PCT Filed: Sep. 14, 2016

(86) PCT No.: PCT/US2016/051703
§ 371 (c)(1),
(2) Date: Mar. 13, 2019

(87) PCT Pub. No.: WO2018/052414
PCT Pub. Date: Mar. 22, 2018

(65) Prior Publication Data
US 2019/0207075 A1    Jul. 4, 2019

(51) Int. Cl.
*H01L 39/04* (2006.01)
*F17C 3/08* (2006.01)
*H01F 6/04* (2006.01)
*G06N 10/00* (2022.01)

(52) U.S. Cl.
CPC ............ *H01L 39/04* (2013.01); *F17C 3/085* (2013.01); *H01F 6/04* (2013.01); *G06N 10/00* (2019.01)

(58) Field of Classification Search
CPC ............ H01L 39/04; F17C 3/085; H01F 6/04
See application file for complete search history.

(56) References Cited

U.S. PATENT DOCUMENTS

| | | | |
|---|---|---|---|
| 5,296,457 A | 3/1994 | Cooke et al. | |
| 7,655,214 B2 * | 2/2010 | Reed ......................... | C01F 7/38 423/592.1 |
| 2003/0222217 A1 | 12/2003 | Luukanen | |
| 2007/0001792 A1 * | 1/2007 | Nemoto ............... | G01R 33/421 335/216 |
| 2013/0288429 A1 * | 10/2013 | Jacquet ................... | B81B 7/007 438/107 |
| 2015/0060650 A1 | 3/2015 | Park | |

(Continued)

FOREIGN PATENT DOCUMENTS

| | | |
|---|---|---|
| JP | 2005-353787 | 12/2005 |
| JP | 2016-042521 | 3/2016 |

(Continued)

OTHER PUBLICATIONS

KR Office Action in Korean Appln. No. 10-2019-7010467, dated Mar. 30, 2020, 13 pages (with English translation).

(Continued)

*Primary Examiner* — Paul A Wartalowicz
(74) *Attorney, Agent, or Firm* — Fish & Richardson P.C.

(57) ABSTRACT

A device includes: a substrate including a superconductor quantum device, the superconductor quantum device including a superconductor material that exhibits superconducting properties at or below a corresponding critical temperature; a cap layer bonded to the substrate; and a sealed cavity between the cap layer and the substrate.

13 Claims, 6 Drawing Sheets

(56) References Cited

U.S. PATENT DOCUMENTS

| | | | | |
|---|---|---|---|---|
| 2015/0334845 A1* | 11/2015 | Niino | ............. | H01L 23/26 |
| | | | | 174/255 |
| 2016/0031706 A1* | 2/2016 | Zheng | ............. | H01L 23/26 |
| | | | | 438/115 |
| 2016/0204330 A1 | 7/2016 | Abraham et al. | | |

FOREIGN PATENT DOCUMENTS

| | | |
|---|---|---|
| JP | 2016-511534 | 4/2016 |
| KR | 10-2016-0046835 | 4/2016 |
| WO | WO 2014/168665 | 10/2014 |
| WO | WO 2016/138395 | 9/2016 |

OTHER PUBLICATIONS

JP Office Action in Japanese Appln. No. 2019-535178, dated Dec. 14, 2020, 6 pages (with English translation).
PCT International Search Report and Written Opinion in International Application No. PCT/US2016/051703, dated Jun. 13, 2017, 13 pages.
PCT International Preliminary Report on Patentability in International Application No. PCT/US2016/051703, dated Mar. 28, 2019, 6 pages.
EP Communication pursuant to Article 94(3) EPC in European Appln. No. 16781215.5, dated Jun. 23, 2020, 4 pages.
JP Office Action in Japanese Appln. No. 2019-535178, dated May 11, 2020, 7 pages (with English translation).
KR Notice of Allowance in Korean Appln. No. 10-2019-7010467, dated Jul. 27, 2020, 3 pages (with English translation).

* cited by examiner

REDUCING DISSIPATION AND FREQUENCY NOISE IN QUANTUM DEVICES USING A LOCAL VACUUM CAVITY

CROSS-REFERENCE TO RELATED APPLICATION

This application is a National Stage Application under 35 U.S.C. § 371 and claims the benefit of International Application No. PCT/US2016/051703, filed Sep. 14, 2016. The disclosure of the foregoing application is hereby incorporated by reference in its entirety.

TECHNICAL FIELD

The present disclosure relates to reducing dissipation and frequency noise in quantum devices using a local vacuum cavity.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in a first aspect, the subject matter of the present disclosure may be embodied in methods that include: providing a substrate including a quantum circuit device, the quantum circuit device including a superconductor material that exhibits superconducting properties at or below a corresponding critical temperature; and bonding a cap layer to the substrate to form a sealed cavity between the cap layer and the substrate, in which the sealed cavity comprises a vacuum.

Implementations of the methods may include one or more of the following features. For example, in some implementations, the pressure within the sealed cavity may be less than or equal to about $10^{-6}$ Torr. The pressure within the sealed cavity may be less than or equal to about $10^{-9}$ Torr.

In some implementations, bonding the cap layer to the substrate may be performed at room temperature.

In some implementations, a surface of the cap layer may be bonded directly to a surface of the substrate to form the sealed cavity.

In some implementations, the cap layer includes a first superconductor layer, the substrate includes a second superconductor layer, and bonding the cap layer to the substrate includes bonding the first superconductor layer to the second superconductor layer. Each of the first superconductor layer and the second superconductor layer may include aluminum.

In some implementations, the methods further include performing, prior to bonding the cap layer to the substrate, ion milling of a surface of the substrate, in which the ion milled surface is exposed to the vacuum within the sealed cavity.

In some implementations, the methods further include etching, prior to bonding the cap layer to the substrate, a surface of the substrate with XeF2 gas, in which the surface is exposed to the vacuum within the sealed cavity.

In some implementations, the quantum device may be within the sealed cavity.

In some implementations, the quantum device includes a qubit, a co-planar waveguide, an inductor, or an interdigitated capacitor.

In some implementations, a surface of the cap layer that faces the sealed cavity comprises a getter layer. The getter layer may include aluminum (Al), titanium (Ti) or zirconium vanadium titanium (ZrVTi).

In general, in another aspect, the subject matter of the present disclosure may be embodied in devices that include: a substrate including a superconductor quantum device, the superconductor quantum device including a superconductor material that exhibits superconducting properties at or below a corresponding critical temperature; a cap layer bonded to the substrate; and a sealed cavity between the cap layer and the substrate.

Implementations of the devices may include one or more of the following features. For example, in some implementations, the pressure within the sealed cavity may be less than or equal to about $10^{-6}$ Torr.

In some implementations, the pressure within the sealed cavity may be less than or equal to about $10^{-9}$ Torr.

In some implementations, the cap layer may be directly bonded to the substrate.

In some implementations, the cap layer includes a first superconductor layer, the substrate includes a second superconductor layer, and the first superconductor layer may be directly bonded to the second superconductor. Each of the first superconductor layer and the second superconductor layer may include aluminum.

In some implementations, a distance between a surface of the substrate facing the sealed cavity and a surface of the cap layer facing the sealed cavity may be greater than about 50 microns. The distance between the surface of the substrate facing the sealed cavity and the surface of the cap layer facing the sealed cavity may be greater than about 200 microns.

In some implementations, the superconductor quantum device includes a qubit, a co-planar waveguide, an inductor or an interdigitated capacitor.

In some implementations, a surface of the cap layer that faces the sealed cavity includes a getter layer. The getter layer may include aluminum (Al), titanium (Ti) or zirconium vanadium titanium (ZrVTi).

Implementations may include one or more of the following advantages. For example, in some implementations, removal of the native oxide and/or contaminants may reduce the presence of lossy dielectrics and/or sources of frequency noise. The use of ion milling to remove a native oxide and other residue may, in some implementations, improve bonding properties of the device. Forming a cavity region under vacuum may, in certain implementations, reduce the re-formation of lossy native oxides. Additionally, in some implementations, exposed superconducting material within the cavity may act as a getter that preferentially adsorb contaminants so the contaminants do not bind to exposed dielectric surfaces, thus further reducing loss associated with the device.

For the purposes of this disclosure, a superconductor (alternatively, superconducting) material can be understood as a material that exhibits superconducting properties at or below a superconducting critical temperature. Examples of superconductor material include aluminum (superconducting critical temperature of 1.2 kelvin) and niobium (superconducting critical temperature of 9.3 kelvin).

For the purposes of this disclosure, a vacuum refers to a space in which the pressure is lower than atmospheric pressure.

For the purposes of this disclosure, a getter refers to material within a vacuum that removes gas molecules from the evacuated spaced by combining with the gas molecules through, e.g., chemical bonds or by absorption.

The details of one or more implementations are set forth in the accompanying drawings and the description below. Other features and advantages will be apparent from the description, the drawings, and the claims.

DETAILED DESCRIPTION

Figure 1:
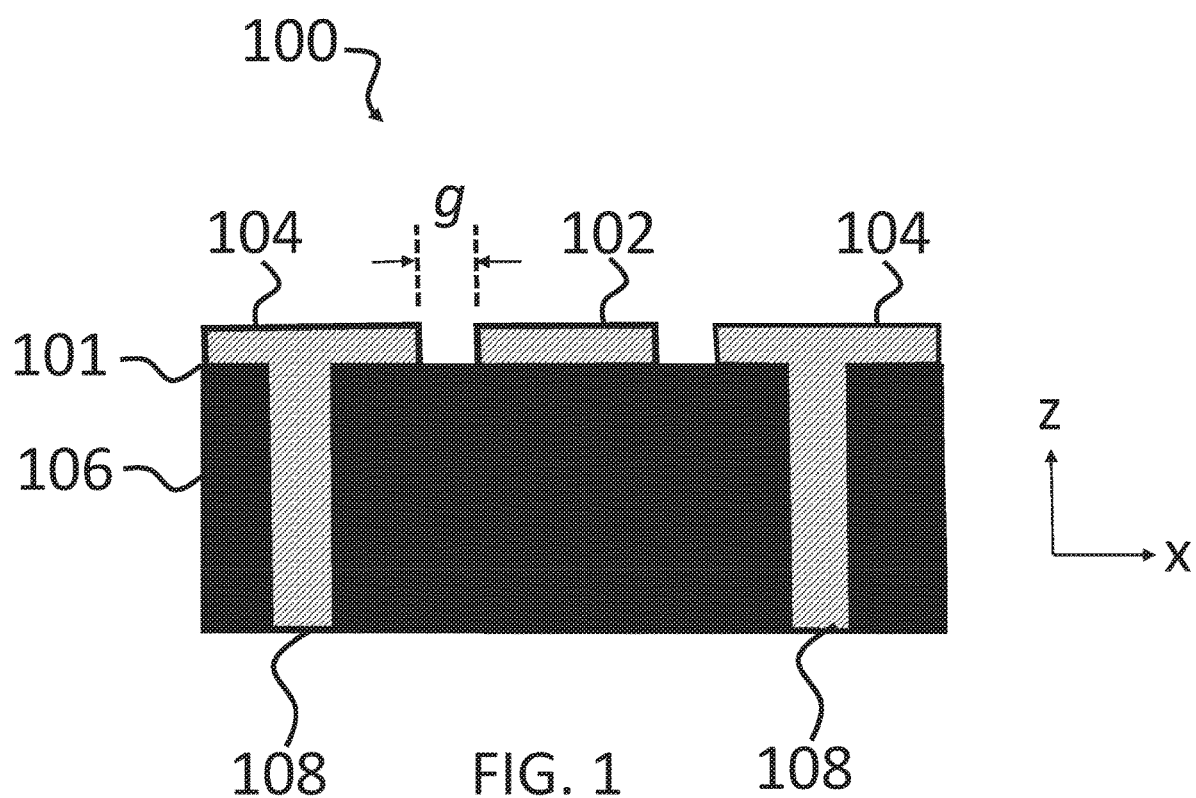
FIG. 1 is a schematic that illustrates a cross-sectional view of an example chip having a superconducting quantum circuit element.

Quantum computing entails coherently processing quantum information stored in the quantum bits (qubits) of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. Superconducting quantum computing is a promising implementation of quantum computing technology in which quantum circuit elements are formed, in part, from superconducting materials. Superconducting quantum computers are typically multilevel systems, in which only the first two levels are used as the computational basis. Such quantum computing devices need to be operated at very low temperatures so that superconductivity can be achieved and so that thermal fluctuations do not cause transitions between energy levels. Additionally, it may be preferable that the quantum circuit elements are operated with low energy loss/dissipation to avoid quantum decoherence. Factors that may lead to energy loss and/or decoherence include, e.g., material defects, electron system excitations, and undesired radiative coupling.

Fabrication of integrated quantum circuit elements with superconducting components typically involves depositing and patterning superconductor materials, dielectrics and metal layers. The superconducting quantum circuit elements (also referred to as quantum circuit devices), such as qubits, inductance based photon detectors, and resonators, among others, rely on low loss reactive microwave components to achieve a high quality factor Q. However, lossy dielectrics located at interfaces often dominate dissipation in the system, thus limiting the performance of the quantum circuit elements. Adsorbates (e.g., $H_2O$ and $O_2$) on exposed surfaces also may lead to dissipation. Another issue that can inhibit the operation of the quantum circuit elements is frequency noise caused by the adsorbates. For instance, at superconducting temperatures, molecular $H_2O$ and $O_2$ may be weakly bound to the exposed surfaces of amorphous dielectrics and native oxides that are adjacent to or part of quantum circuit elements. Minor temperature variations may cause the spin of those weakly bound molecules to fluctuate, giving rise to a magnetic field that interacts with the quantum circuit elements (e.g., the qubits). The variable magnetic field may control the circuit element to a small degree, causing undesired fluctuations in qubit frequency. This frequency jitter is also referred to as "1/f noise."

The present disclosure relates to reducing the dissipation and frequency noise resulting from lossy interfaces and surface adsorbates by enclosing the exposed surfaces of the quantum circuit elements in a local vacuum environment. The vacuum environment may reduce the number of molecules that are weakly bound to the exposed surfaces of the device, leading to, e.g., a decrease in frequency jitter. Furthermore, because the quantum circuit elements will be maintained in a vacuum environment, a pretreatment option that removes potentially lossy material (e.g., native oxides) may be introduced to the fabrication process. In some implementations, the vacuum environment prevents reformation of the lossy material, further reducing dissipation that would otherwise be caused by the lossy material presence. Additionally, certain surfaces within the vacuum environment may be coated with materials that act as "getters" to which remaining adsorbates can strongly bond, thus further limiting the adsorbates role in causing frequency noise.

FIG. 1 is a schematic that illustrates a cross-sectional view of an example chip having a superconducting quantum circuit element 100 and that may be used in superconducting quantum computer systems. In the present example, the structure 100 may be a superconducting co-planar waveguide. Superconducting co-planar waveguides can be used, for example, as resonant devices for circuit quantum electrodynamics (circuit QED) (e.g., measurement resonators), as elements for quantum computation, and to create and decohere quantum photon states, among other uses. Implementations of the present disclosure will be described in further detail with reference to the co-planar waveguide structure 100. However, other superconducting quantum circuit elements, such as qubits, interdigitated capacitors, or linear inductors, may be used instead of or in addition to the co-planar waveguide 100.

The co-planar waveguide structure 100 includes a signal carrying centerline 102 flanked by two grounded planes 104, each of which is formed from superconductor material, such as aluminum (Al) or niobium (Nb). As FIG. 1 presents a cross-section view of the structure 100, it is understood that the ground planes 104 and centerline 102 extend into and/or out of the page (e.g., along the y-direction). The superconductor material may have thicknesses in the range of about several nanometers to about several microns. The planar superconducting structure may be arranged on a surface 101 of a dielectric substrate 106 (e.g., silicon (Si) or sapphire ($Al_2O_3$)) typically by a material deposition and photolithographic patterning process. Other circuit elements may be formed using the same general process of material deposition and patterning. The centerline 102 may be separated from the ground planes 104 on either side by a gap of distance g. In some implementations, through-via connections 108 extend from a back surface of substrate 106 through substrate 106 to surface 101 to provide electrical connections (e.g., ground connections or control lines) to the quantum circuit elements. The through-via connections 108 may be formed using, e.g., photolithography and deep-reactive ion etching to form vias within the substrate 106, followed by filling the vias with the connection material (e.g., using a plating or deposition process). In some implementations, the through-via connections 106 may also couple to other quantum circuit elements formed within the substrate 106 or on the back surface. The substrate itself may have a thickness that ranges, e.g., from about several microns to several hundreds of microns.

During operation of a quantum computing system that uses superconducting quantum circuit elements, such as the co-planar waveguide structure 100, the circuit elements are cooled down within a cryostat to temperatures that allow a superconductor material to exhibit superconducting properties. For example, for superconducting quantum circuit elements formed using aluminum, the superconducting critical temperature is about 1.2 kelvin, whereas for superconducting quantum circuit elements formed using niobium, the superconducting critical temperature is about 9.3 kelvin. As the quantum circuit elements are cooled, molecules such as $O_2$ and/or $H_2O$, are thought to weakly bind to amorphous surface dielectrics and native oxides (e.g., $AlO_x$). As explained herein, these weakly bound adsorbates may increase dissipation and also lead to an increase in frequency noise. To avoid the detrimental effects from weakly bound adsorbates, many of the adsorbates may be removed by operating the quantum circuit elements under vacuum. Obtaining a sufficient vacuum within the cryostat can be difficult, however, given that the system operates with a light-tight configuration to avoid stray light that may increase loss in superconducting resonators and qubits. An alternative is to place the chip containing the quantum circuit elements within a separate local box within the cryostat, in which the local box is pumped down to vacuum. The use of a local vacuum box requires providing input and output connections, the number of which can become unwieldy as more quantum circuit elements and qubits are added to the chip.

Figure 2A:
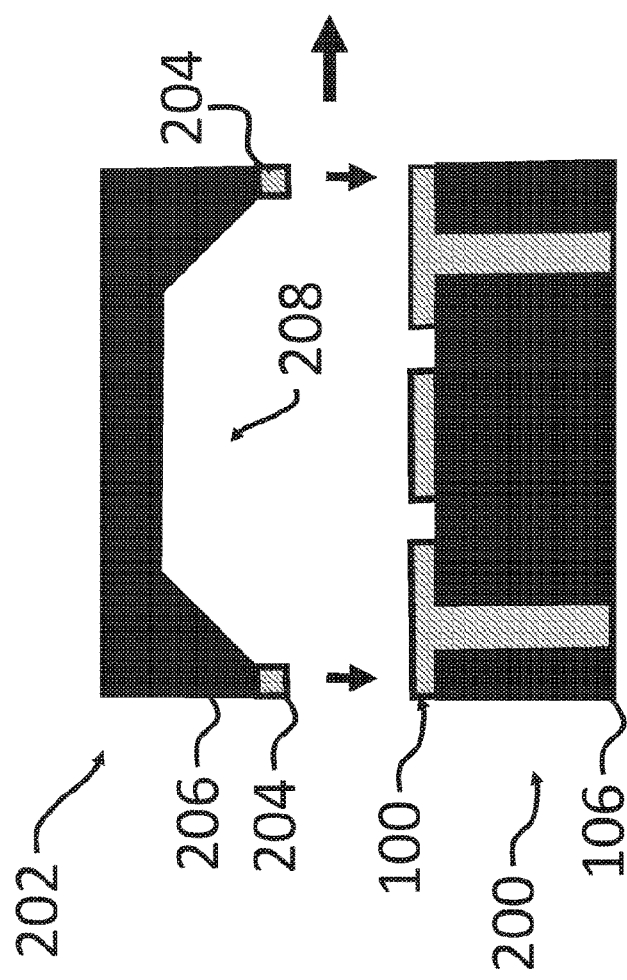
FIGS. 2A-2B are schematics that illustrate an example of establishing a local vacuum environment for a chip containing a quantum circuit element.
Figure 2B:
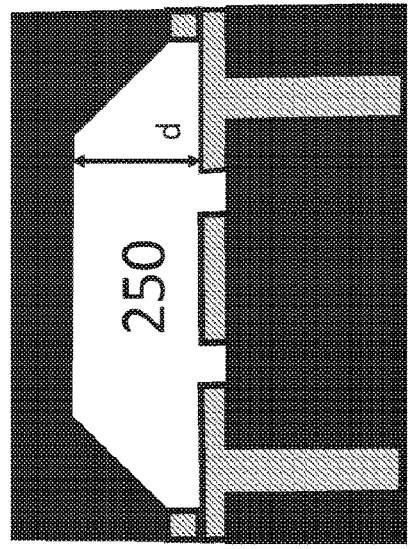

FIGS. 2A-2B are schematics that illustrate an example of establishing a local vacuum environment for quantum circuit elements. As depicted in those figures a chip 200 containing a superconducting quantum circuit element, such as the circuit element 100 described with respect to FIG. 1, is bonded, under vacuum, to a cap layer 202 to form a sealed cavity 250 between the cap layer 202 and the chip 200. Though FIGS. 2A-2B only show cross-sections, the cap layer 202 and chip 200 may be understood to bond to one another at regions along the y-axis (e.g., at regions that are in and out of the page) as well to provide a hermetic seal. The vacuum may be maintained within cavity 250 even though the bonded chip-cap layer structure is moved to a higher pressure environment, such as atmospheric pressure. Because the cap layer 202 is bonded to the chip 200 under vacuum, adsorbates that normally would be present under atmospheric pressure are unavailable to weakly bind to the exposed surfaces of the quantum circuit element 100. Furthermore, by hermetically bonding the cap layer 202 to chip 200, the cavity 250 is sealed so that adsorbates cannot enter.

The cap layer 202 includes a substrate 206 and a bonding layer 204 on a surface of the substrate 206. The substrate 206 may include, e.g., a silicon or sapphire wafer or portion of a wafer. The bonding layer 204 may include, for example, a superconducting material such as aluminum or niobium that bonds to a corresponding positioned material on the chip 200. Other materials, such as indium or tin, also may be used. For improved bonding, the material of the bonding layer 204 should be the same as the material to which it will bond in the chip 200. For example, both materials may include the same superconductor. The material on chip 200 to which layer 204 bonds may include a portion of the circuit element 100. For example, layer 204 may bond to a ground plane. Alternatively, the material on chip 200 to which layer 204 bonds may be separate from (e.g., physically and electrically separate from) the circuit element 100. For instance, the material on chip 200 to which layer 204 bonds can be a separate bonding layer.

As shown in FIGS. 2A-2B, the sealed cavity 250 may be defined by/delineated by a concave region 208 and portions of the exposed surfaces of the superconducting quantum circuit element 100 and substrate 106 from chip 200. The concave region 208 may be formed within cap layer 202 by a combination of photolithography and etching. For example, photolithography may be used to define a region of the substrate 206 for etching. The defined region of the substrate 206 then may be partially etched using either a dry (e.g., reactive ion etching) or wet etching (e.g., KOH) technique. The etch time may be adjusted to vary the height of the concave region, and thus also define the height d of the cavity 250. The distance between a surface of the chip layer that faces the quantum circuit element may be, e.g., at least 1 micron, at least 5 microns, at least 10 microns, at least 20 microns, at least 50 microns, at least 100 microns, at least 250 microns, at least 500 microns. Other distances are possible as well.

Figure 3:
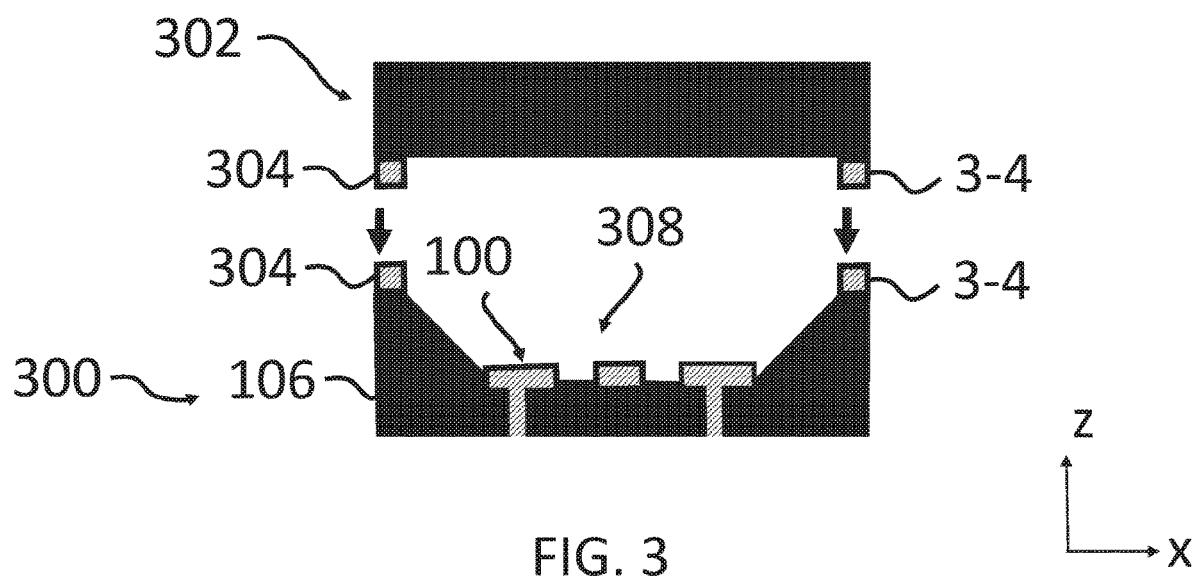
FIG. 3 is a schematic that illustrates an example of establishing a local vacuum environment for a chip containing a quantum circuit element.

Alternatively or in addition, in some implementations, the quantum circuit elements may be formed in a concave region of the chip. For instance, FIG. 3 is a schematic that illustrates an example of establishing a local vacuum cavity for a chip 300 containing a quantum circuit element, such as circuit element 100 shown in FIG. 1, in which the quantum circuit element 100 may be formed within a concave region 308 of the chip 300. The concave region 308 may be fabricated in a similar manner to region 208, as described above. Though not shown in FIG. 3, the cap layer 302 may also include a concave region that aligns over and with the concave region 308 of the chip 300 upon bonding. Bonding layers 304 may be provided on each of the cap layer 302 and the chip 300. Bonding layers 304 may include, e.g., a material that exhibits superconducting properties when cooled to below a corresponding critical temperature, such as aluminum, niobium or titanium nitride. When joining the cap layer 302 to chip 300, the layers 304 bond to one another and form a hermetic seal of the cavity.

Figure 4:
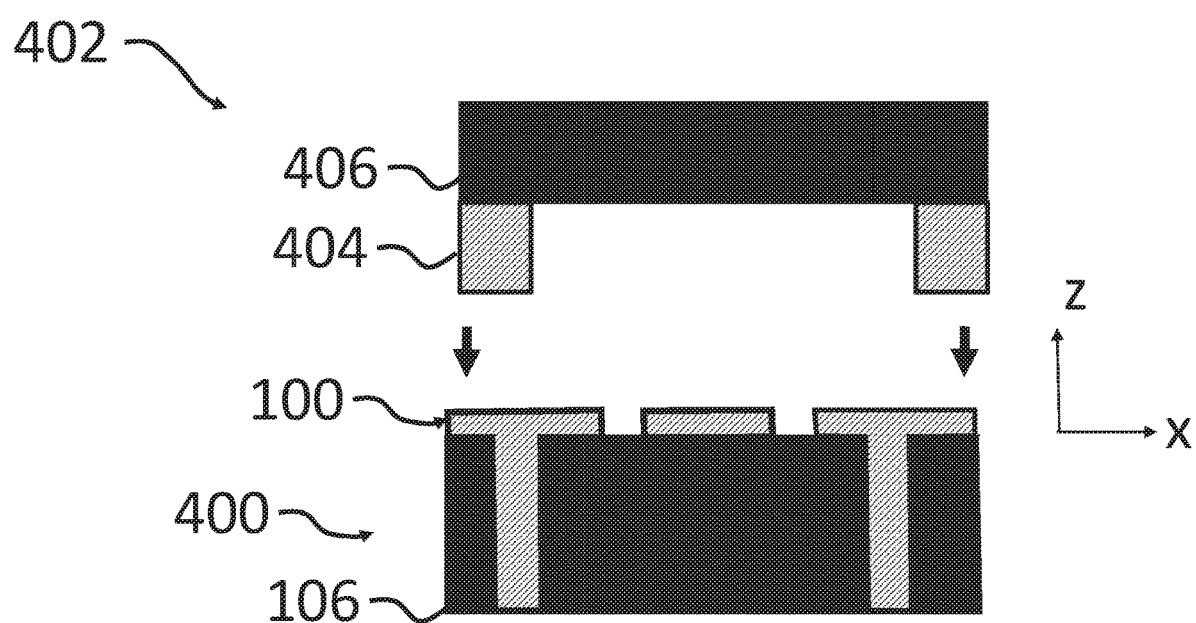
FIG. 4 is a schematic that illustrates an example of establishing a local vacuum environment for a chip containing a quantum circuit element.

Alternatively, in some implementations, the region forming the sealed cavity may be defined without having to etch a concave region in either the chip or the cap layer. For example, one or more layers of material may be added to the cap layer and/or to the chip to form the walls of the cavity region. An example cross-section of such a structure is shown in FIG. 4, which is a schematic that illustrates an example of establishing a local vacuum cavity for a chip 400 containing a quantum circuit element, such as the circuit 100 shown in FIG. 1. As shown in FIG. 4, a thickness of the bonding layer 404 may be increased to create a space/cavity region between the structure 100 and a surface of the substrate 406 facing chip 400. For example, the bonding layer 404 may have a thickness of about several microns to several tens of microns. Instead of increasing the thickness of the bonding layer 404 to create the cavity region, an alternative approach includes adding one or more layers of material to the surface of substrate 406 and/or to the chip 400 (e.g., through deposition or bonding), patterning those added layers to form the cavity walls and cavity region, and then forming the bonding layer on the walls.

Referring to FIGS. 2A-2B, the process of bonding the cap layer 202 to the chip 200 containing the quantum circuit element 100 will now be described. After forming the quantum circuit element 100 and the bonding layer 204, the exposed surfaces of the cap layer 202 (e.g., the bonding layer 204) and of the chip 200 (e.g., the ground lines associated of the quantum circuit element 100) are prepared for joining. In some implementations, preparation of the exposed surfaces includes performing ion milling of the bonding layer 204 and the corresponding material on chip 200 to which the bonding layer 204 adheres. Ion milling includes directing ions (e.g., argon ions) at the surface of the exposed layer at an acute or obtuse angle and sputtering material from the surface. For example, in some implementations, ion milling can be performed in an ion milling machine by flowing Ar gas at about 3.6 sccm at a pressure of $3.7*10^{-4}$ mBar, without heat being added (e.g., under an ambient temperature of a manufacturing facility in which the device is being fabricated). When ion milling is applied to a superconductor, it is believed that the ion milling activates the surface structure of the superconductor to provide improved bonding properties. That is, ion milling removes the native oxides and/or contaminants (e.g., photoresist residues) from the surface of the superconductor material such that a room temperature or near room temperature wafer bonding can be achieved (e.g., at about an ambient temperature of the manufacturing facility in which the device is fabricated). Removal of the native oxide and/or contaminants also may provide, in some implementations, the additional advantage of reducing the presence of lossy dielectrics that lead to dissipation/energy loss in the system, resulting in an improvement in quality factor for the circuit elements.

Following the ion mill activation of the surfaces of the chip 200 and the cap layer 202, the chip 200 and cap layer 202 are joined together. Joining the chip 200 to the cap layer 202 may include, for example, bonding the chip 200 to the cap layer 202. Bonding may include a direct bond of the bonding layer 204 on the cap layer 202 to a corresponding bonding material on the chip 200. The bonding process may be a direct bonding process, in which there is no intervening layer between the bonding layer 204 and the corresponding bonding material on the chip 200. The bonding process may be a cold welding process in which the bonding layer 204 is joined with the corresponding bonding material on the chip 200 without the use of heat, by forcing the two components together with applied pressure. The bonding process may be an indirect bonding process, in which an adhesive is applied to the bonding layer 204 and/or to the corresponding bonding material on the chip 200. The adhesive may include, e.g., a polymer that is cured after contacting the chip 200 to the cap layer 204.

In the example of FIGS. 2A-2B, the cap layer 202 is joined to the chip 200 by bringing the bonding layer 204, which may be a superconductor material, into direct contact with the ground planes of the quantum circuit element 100, which may also include the same or different superconductor material. Preferably, both the cap layer 202 and chip 200 are maintained under vacuum following the ion milling through the bonding step. The range of pressure for the vacuum can be between approximately $10^{-7}$ Torr to approximately $10^{-9}$ Torr. After bonding, the pressure within the sealed cavity will be substantially the same as the pressure of the vacuum environment during bonding.

Joining the chip 200 to the cap layer 202 may require relatively little pressure. For instance, a few pounds of pressure (for a wafer of approximately 3 inch diameter, e.g., about a few kPa) may be sufficient to obtain an adequate bond between the chip 200 and the cap layer 202 as in a cold-welding process. For example, to achieve adequate bonding, the applied pressure (applied, e.g., in a direction orthogonal to the surfaces being bonded) can be a non-zero pressure that is less than or equal to 1 kPa, less than or equal to 2 kPa, less than or equal to 3 kPa, less than or equal to 4 kPa, less than or equal to 5 kPa, less than or equal to 6 kPa, less than or equal to 7 kPa, less than or equal to 8 kPa, or less than or equal to 9 kPa, among other pressures. In some implementations, however, greater pressure may be applied.

The joining of chip 200 and cap layer 204 also may be performed at an ambient temperature of the manufacturing facility in which the device is constructed (e.g., in the range of approximately 18° C. and approximately 30° C.). An advantage of joining (e.g., bonding) the cap layer 202 and chip 200 without adding heat, may be that the formation of hillocks and voids, and the diffusion that might otherwise occur, are absent within the device materials, so that the circuit components can maintain low loss. In addition, the absence of heat being applied during the bonding process also may, in some implementations, prevent an increase in loss that would occur at the bonding interface between the cap layer 202 and the chip 200. In some implementations, additional heat can be applied during the bonding process if desired. However, the temperature should preferably be kept below approximately 150° C., which is the typical temperature at which the hillocks and/or voids begin to form and diffusion across interfaces increases sufficiently enough to generate noticeable losses at the interfaces between dielectrics and superconductors and between superconductors. For example, the bonding process can be performed between approximately 18° C. and approximately 150° C., such as between approximately 100° C. and approximately 150° C., between approximately 18° C. and approximately 100° C., or between approximately 18° C. and approximately 30° C. An approximate temperature value can have a measurement uncertainty within plus or minus 1 degree of the stated temperature. The relatively low temperature bonding can be performed using, e.g., the Bond Meister available from Mitsubishi Heavy Industries, Ltd.

The ion milling process that is used to enhance bonding and remove native oxides may, in certain instances, actually damage the surface of materials that, unlike the native oxides, are intended to form a part of quantum circuit elements or other components in the chip 200. These materials may include, e.g., the substrate 106 (e.g., Si or sapphire substrate). To moderate or removed the damaged dielectric portions, an additional $XeF_2$ etch may be introduced subsequent to the ion milling and prior to bonding. For instance, in some implementations, the chip 200 and/or cap layer 202 may be transferred to a $XeF_2$ etch system after performing the ion milling. In the $XeF_2$ etch system, the devices are exposed to $XeF_2$ gas, which adsorbs to the dielectric surface.

In the case of Si as the dielectric, the $XeF_2$ then dissociates to Xe and F, which in turn forms highly volatile $SiF_4$ that can be removed under low pressure, and thus removes the damaged silicon. In some implementations, the $XeF_2$ may even improve the reactivity of the superconductor surfaces, leading to stronger bonding. The $XeF_2$ etch may be conducted under vacuum pressures in the, e.g., mTorr-Torr regime. The etch may also be conducted between about room temperature (e.g., about 25° C.) to about 100° C.

Another advantage of removing native oxides from the superconductor and/or metal layers of the chip 200 and/or cap layer 202 may be that, in some implementations, adsorbates tend to strongly bond to the surfaces from which the native oxides have been removed. Thus, adsorbates within the sealed cavity that have not been removed by the vacuum environment prior to bonding are more likely to strongly bond to the surfaces of the superconductor and/or metal materials than to weakly bond to a dielectric, further reducing frequency noise. That is to say, the surfaces of the superconductors and/or metals from which a native oxide has been removed serve as getters for the adsorbates.

The use of superconductor and/or metal surfaces, from which a native oxide has been removed, as a getter may be leveraged by increasing the surface area of such material within the sealed cavity. That is, additional layers of superconductor and/or metal layers may be formed on unused regions of the cap layer 202 and/or chip 200 that face the cavity. By increasing the surface area of superconductor and/or metal material that acts as a getter, more adsorbates may be removed from the cavity (e.g., by strongly binding to the additional getter material), further reducing frequency noise.

Figure 5A:
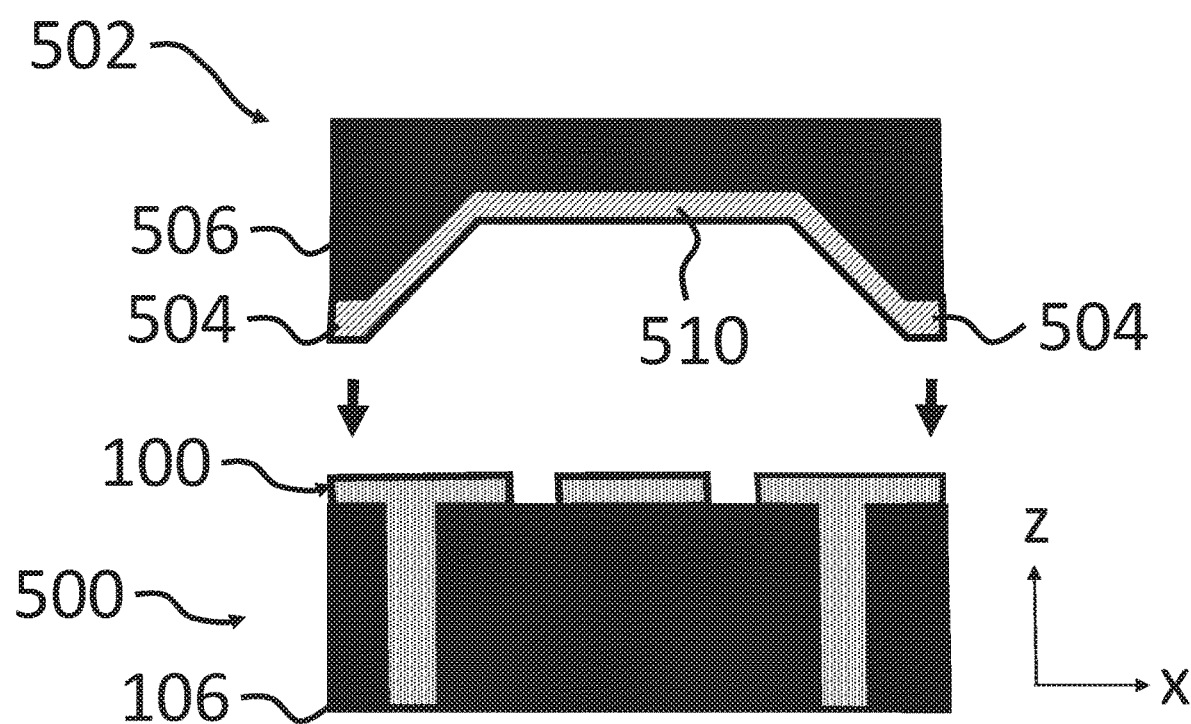
FIG. 5A is a schematic that illustrates an example of establishing a local vacuum environment for a chip containing a quantum circuit element.

For example, the bonding layer on the cap layer surface may be extended to increase the surface area useable as a getter, as shown in FIG. 5A. FIG. 5A is a schematic that illustrates an example of establishing a local vacuum cavity for a chip 500 containing a quantum circuit element, such as circuit element 100 shown in FIG. 1, in which the circuit element 100 is formed on substrate 206 of chip 500. The chip 500 may be bonded to a cap layer 502 that includes a corresponding substrate 506 and bonding layer 504. In contrast to the bonding layer 204 of FIG. 2A, the surface coverage of the bonding layer 504 may be increased to provide an additional area 510 that extends over the entire surface of the substrate 506 that faces the chip 500, rather than being limited to just the regions that are intended to join with the chip 500. In some implementations, adsorbates remaining in the sealed cavity preferentially bind to the increased surface area 510 of the bonding layer 504, leading to an improvement in quality factor of circuit elements formed on the chip 500.

Figure 5B:
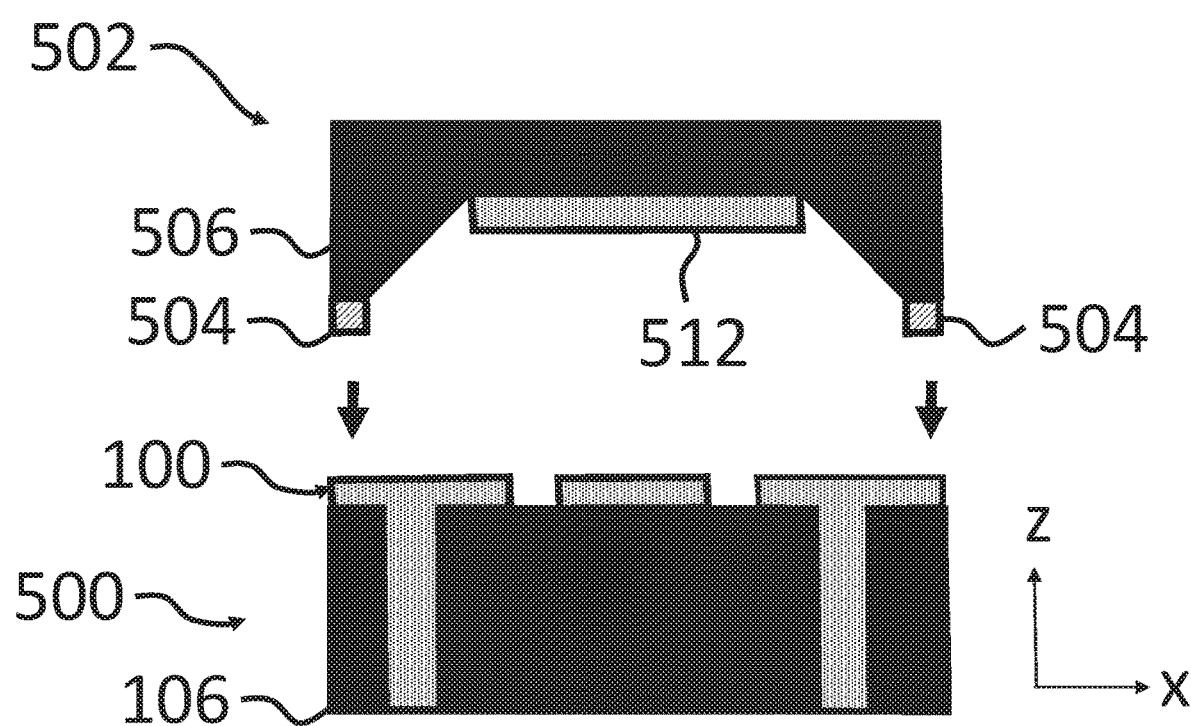
FIG. 5B is a schematic that illustrates an example of establishing a local vacuum environment for a chip containing a quantum circuit element.

It is not necessary for the additional getter material to be integrally connected to the bonding layer as shown in FIG. 5A. For example, in some implementations, the additional material to be used as a getter layer may be formed separately from the bonding layer 504. FIG. 5B is a schematic that illustrates an example of establishing a local vacuum cavity for a chip 500 containing a quantum circuit element, such as circuit element 100 shown in FIG. 1, in which an additional getter layer 512 is formed on a surface of cap layer 502. The additional getter layer 512 again performs the function of providing a surface to which adsorbates will preferentially bind. The getter layer 512 may be formed from the same material as the bonding layer 504 or may be formed from a different material, such as a material that more strongly binds to adsorbates than the material that forms the bonding layer 504. For example, the getter layer 512 may be formed from titanium or a zirconium vanadium titanium alloy. Other materials may be used as well, such as aluminum, titanium, niobium, or silicon. The getter layer 512 may be formed on the cap layer 502 as shown in FIG. 5B and/or the getter layer 512 may be formed on regions of the chip 500 surface that face the sealed cavity and that are not being utilized by circuit elements.

In some implementations, the ability of the getter layer 512 (or the bonding layer 504 as shown in FIG. 5A) to bind to adsorbates that are within the sealed cavity may be improved by roughening the surface of the getter layer 512. By roughening the surface of the getter layer 512, the surface area to which the adsorbates may bind increases, resulting in a greater concentration of adsorbates binding to the getter layer 512. Various different techniques are available to roughen the surface of the getter layer 512. For example, in some implementations, the surface of the getter layer 512 may be roughened using etching processes, such as ion milling or the $XeF_2$ etch. For example, $XeF_2$ etching of silicon can leave a very rough surface upon which the getter can be deposited. The roughness is caused by the etching occurring at the molecular level providing a roughness at various different length scales and therefore much more surface area then an atomically smooth Si surface on a Si wafer that may otherwise be obtained directly from a manufacturer.

In the implementations disclosed herein, deposition of dielectrics, superconductors, and/or metals can be performed using, e.g., a physical vapor deposition process such as sputtering, thermal evaporation, or e-beam deposition. Other deposition processes may be used instead. The thickness of the deposited superconductor layers can be selected based on the desired end use for the superconductor (e.g., whether the layer will be part of a ground plane, a plate of a capacitor, a routing wire, a microstrip, a resonator, or other component). As an example the thickness of the superconductor layer can range between about 1 nm to about 1 micron, though other thicknesses are also possible.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context.

Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Accordingly, other implementations are within the scope of the following claims.

What is claimed is:

1. A device comprising:
a substrate comprising a superconductor quantum computing circuit device, the superconductor quantum computing circuit device comprising a superconductor material that exhibits superconducting properties at or below a corresponding critical temperature;
a cap layer bonded to the substrate to form a sealed cavity entirely enclosed within and by the cap layer and the substrate, wherein a surface of the cap layer that faces the sealed cavity comprises a roughened getter layer, and wherein the pressure within the sealed cavity is less than or equal to about $10^{-6}$ Torr.

2. The device of claim 1, wherein the cap layer comprises a first superconductor layer, the substrate comprises a second superconductor layer, and the first superconductor layer is directly bonded to the second superconductor.

3. The device of claim 2, wherein each of the first superconductor layer and the second superconductor layer comprises aluminum.

4. The device of claim 1, wherein a distance between a surface of the substrate facing the sealed cavity and a surface of the cap layer facing the sealed cavity is greater than about 50 microns.

5. The device of claim 4, wherein the distance between the surface of the substrate facing the sealed cavity and the surface of the cap layer facing the sealed cavity is greater than about 200 microns.

6. The device of claim 1, wherein the sealed cavity provides a local vacuum, and the device is arranged in a chamber having a pressure that is higher than the pressure within the sealed cavity.

7. The device of claim 6, wherein the chamber is within a cryostat.

8. The device of claim 1, wherein the pressure within the sealed cavity is less than or equal to about $10'$ Torr.

9. The device of claim 1, wherein the cap layer is directly bonded to the substrate.

10. The device of claim 1, wherein the superconductor quantum computing circuit device comprises a qubit, a co-planar waveguide, an inductor or an interdigitated capacitor.

11. The device of claim 1, wherein the getter layer comprises titanium (Ti) or zirconium vanadium titanium (ZrVTi).

12. The device of claim 1, wherein a native oxide is removed from a surface of the getter layer.

13. The device of claim 1, wherein the device is arranged within a cryostat.

* * * * *